March 24, 1970 H. B. GORDON 3,501,831

EYELET

Filed June 17, 1968 2 Sheets-Sheet 1

INVENTOR
HERMAN B. GORDON
BY Fishman & Van Kirk
ATTORNEYS

March 24, 1970 H. B. GORDON 3,501,831

EYELET

Filed June 17, 1968 2 Sheets-Sheet 2

3,501,831
Patented Mar. 24, 1970

3,501,831

EYELET

Herman B. Gordon, Tempe, Ariz., assignor to Rogers Corporation, Rogers, Conn., a corporation of Massachusetts Filed June 17, 1968, Ser. No. 737,504
Int. Cl. H05k *3/30*
U.S. Cl. 29—625 1 Claim

ABSTRACT OF THE DISCLOSURE

A through-hole connection for printed circuits comprising eyelets formed by drawing copper foil conductors into the desired connector shape while simultaneously punching through the circuit board. The drawn eyelets extend completely through the board thereby enabling soldering from either side thereof. In the case of multilayer circuitry, interconnection between various levels in the circuit may be achieved by interconnecting the drawn eyelets by means of wave soldering.

BACKGROUND OF THE INVENTION

Field of the invention

The precent invention relates to printed circuits. More particularly, the present invention relates to the formation of through connections in single or multilayer printed circuits. Accordingly, the general objects of the present invention are to provide novel and improved methods and apparatus of such character.

Description of the prior art

The electronics industry has long sought reliable and economical techniques and/or structures which would permit the soldering of compenents to printed circuit boards from either side of the board. To enable soldering from either side of the board, it is necessary that vertical conductive paths be provided therein. Similarly, in the case of multilayer circuitry, inexpensive and reliable means for providing electrical connection layer-to-layer have long been desired.

In order to permit the mounting of active or passive circuit components on a printed circuit board, it is necessary that through-hole connectors be of generally annular shape when viewed in cross section. In order to provide through-holes with conductive walls and simultaneously produce a structure which has sufficient exposed conductive material to enable soldering from either side of the circuit board, two techniques have been generally employed in the prior art. The first of these techniques consists of the insertion of preformed eyelets into holes formed in the printed circuit, such holes extending through one or more conductors on surfaces of or, in the case of multilayer circuitry, at layers in the circuit. The use of eyelets, as is well known to those skilled in the art, has greately increased manufacturing difficulties due in part to the comparatively large number of manipulative steps required in insertion. In addition, since the eyelets are not integral with the conductors which form the printed circuit, the use of preformed eyelets increases the number of solder connections in the circuit and accordingly decreases reliability.

In an attempt to avoid the use of eyelets, a great deal of study has been given to the use of plated through-holes.

Plated holes have to date been lacking in reliability, the techniques involved in plating on non-conductive circuit board materials have been relatively time consuming and difficult to control, and the resulting structure has often been discontinuous and usually has failed to provide sufficient conductive material in areas where there was no underlying copper conductor to permit reliable bonding of component leads in such areas.

SUMMARY OF THE INVENTION

The present invention overcomes the foregoing and other disadvantages of the prior art by providing a through-hole connection which is formed from and thus integral with the conductors of the printed circuit. The through-hole connectors of the present invention are formed by drawing, via either a single or multiple-step process, eyelets from terminal pad areas of a printed circuit while simultaneously punching a hole through the circuit board or multilayer circuit. The thus drawn eyelets will extend through the circuit board or layer of a multilayer circuit. In the case of a single board, soldering to the drawn eyelet where it extends through the board is permitted and, if desired, excess circuit board material which has been distored in the formation of the eyelet may be mechanically or chemically removed to facilitate electrical connection with eyelet. In the case of multilayer circuitry, the drawn eyelets may be connected layer-to-layer within the circuit by means of wave soldering techniques thereby obviating the necessity to use unreliable plating processes.

BRIEF DESCRIPTION OF THE DRAWING

The present invention may be better understood and its numerous advantages will become apparent to those skilled in the art by reference to the accompanying drawing wherein like reference numerals refer to like elements in the various figures and in which.

DESCRIPTION OF THE PREFERRED EMBODIMENT

Figure 1:
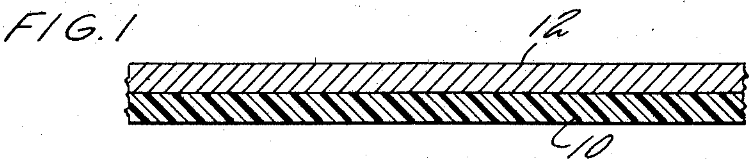
FIGURE 1 is a cross-sectional, side elevation view of a portion of a printed circuit prior to operation thereon in accordance with the present invention.

With reference now to FIGURE 1, a portion of a printed circuit is shown in cross section. The printed circuit of FIGURE 1 comprises a substrate or base 10 which supports a plurality of conductors, only one of which 12 is shown. While not limited thereto in its utility, the present invention is particularly well suited for use with flexible circuitry wherein the substrate or circuit board 10 comprises a relatively thin, flexible sheet of dielectric material. Preferably, the dielectric material used in the present invention will be a synthetic film, for example an aromatic polyamide-imide resin.

The conductors, such as conductor 12, will be formed from a metallic foil, copper being the usual material. While the conductors may be preformed by die stamping techniques, in most instances a layer of copper foil will be bonded to the substrate 10 by use of techniques standard in the printed circuit field. For example, when employing a polyamide-imide resin film, the dielectric material is cast directly onto the copper without adhesives. After mating the copper foil and the plastic film, the desired conductive paths will be formed by means of well-known resist and etching techniques.

Figure 2:
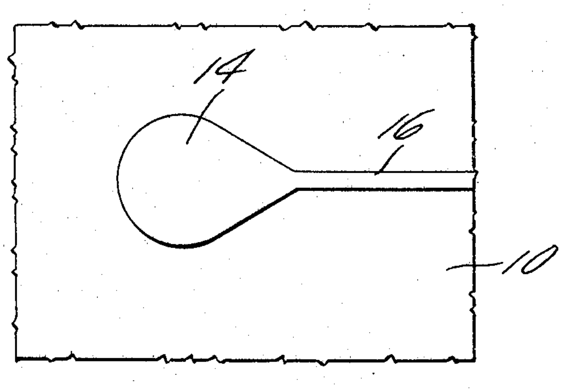
FIGURE 2 is a top view of the article of FIGURE 1.

Thus, as may be seen from FIGURE 2, the copper foil 12 will be masked so that, after etching and subsequent washing to remove resist material, conductors and enlarged terminal areas will be provided. In FIGURE 2, a terminal pad 14 is integral with a conductor 16 and thus no potentially unreliable solder joint or other interconnection is necessary between the conductor and terminal pad.

It is to be noted that the thickness of the thin plastic insulating film or substrate 10 and the copper forming the conductive paths and terminal pads in the disclosed embodiments is substantially the same, although they need not necessarily be so, and that there are no adhesive materials or the like disposed between the conductive material and substrate. It is also to be noted that the material employed as the substrate in the present invention will be cured prior to the steps to be described below.

Figure 3:
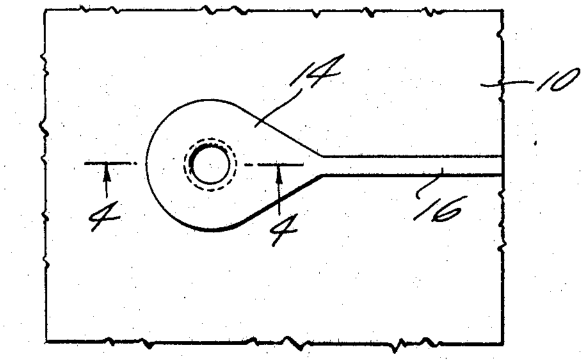
FIGURE 3 is a top view, similar to FIGURE 2, depicting a through-hole connector formed in accordance with the present invention.
Figure 4:
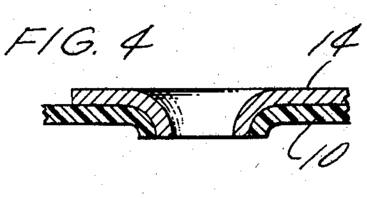
FIGURE 4 is a cross-sectional, side elevation view, taken along line 4—4 of FIGURE 3, depicting a first embodiment of the present invention.
Figure 8:
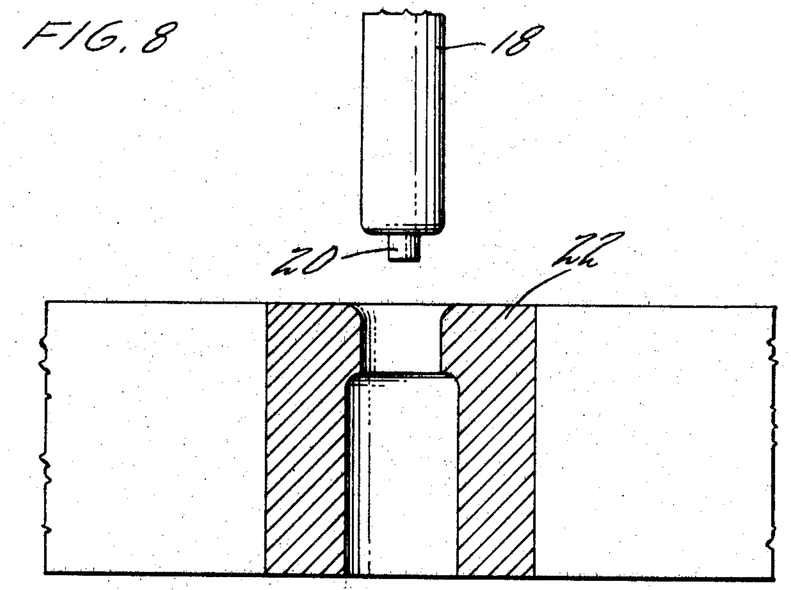
FIGURE 8 is a cross-sectional, side elevation view of tooling of the type which may be used in performance of the present invention.

Referring now simultaneously to FIGURES 3, 4 and 8, it may be seen that the conductive material at the terminal pad 14 is drawn into an eyelet configuration. The drawing is accomplished mechanically by means of tooling such as that shown in FIGURE 8 and one to twenty sequential tools will be used to form an eyelet depending on eyelet configuration and the materials and their thicknesses employed as the substrate and conductors. Briefly, the tooling will consist of an extruding punch 18 having a prepiercing punch 20 and, positioned beneath the work, an extruding die 22. The drawing step or steps results in the pad material extending completely through and out of the rear side of the substrate 10. Thus, an apertured or annular conductor extending completely through and protruding from the side of the substrate opposite to the terminal pad will be provided.

As will be obvious from FIGURE 4, the substrate material will also be deformed during the drawing operation. If desired, after the eyelet has been formed and prior to the insertion of components, the substrate material which conforms to the exterior surfaces of the drawn eyelet may be removed. Such removal was performed on the embodiment of the invention shown in FIGURE 5. The removal of the deformed substrate material may be done mechanically but preferably will be accomplished by chemically etching the plastic film material. A preferable chemical etching technique, where the substrate 10 is comprised of a polyamide-imide film, is disclosed in U.S. Patent No. 3,331,718, issued to Charles R. Ruffing and assigned to the assignee of the present invention.

The connection or eyelet of FIGURE 4, by virtue of its extending beyond the rear or opposite surface of the substrate 10, may be soldered to from either side of the printed circuit board. The ability to solder from either side of the printed circuit board after the insertion of leads from passive or active circuit components into the through-hole connectors has, as noted above, long been desired. As also previously noted, in those instances in the prior art where soldering from either side of the board was possible, this advantage was achieved only at the expense of the use of unreliable techniques such as through-hole plating or the use of insertable eyelets. It is particularly to be noted that the through-hole connection of the present invention is integral with the conductors on the printed circuit and, as a result of there being no discontinuity in the conductive path between the conductors and through-hole connectors, unreliable solder joints and plated connections are eliminated. Similarly, through use of the present invention, numerous other expensive and unreliable manufacturing techniques, such as the various steps involved in plating on nonconductive materials and manipulating eyelets prior to insertion, have been eliminated.

Figure 5:
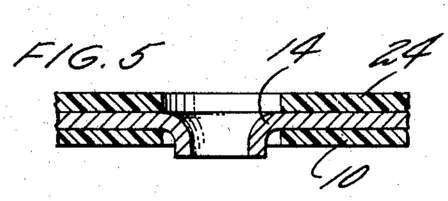
FIGURE 5 is a cross-sectional, partial side elevation view of a second embodiment of the present invention.

Referring again to FIGURE 5, the present invention is shown in the environment where the conductive material is sandwiched between a pair of thin, plastic insulating films 10 and 24. In the embodiment of FIGURE 5, the usual procedure will be to first expose the upper surface of terminal pad 14, such exposure being accomplished by use of the techniques of the aforementioned Ruffing patent in the case of polyamide-imide substrates. Thereafter, the eyelet is drawn in the manner above described. Alternatively, the eyelet may be drawn while simultaneously punching through the upper insulating film 24 and the insulating films 10 and 24 thereafter selectively etched to provide the through-hole connector of FIGURE 5.

Figure 6:
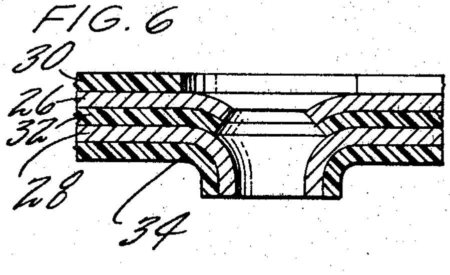
FIGURE 6 is a cross-sectional, partial side elevation view of the present invention as employed in association with multilayer circuitry.
Figure 7:
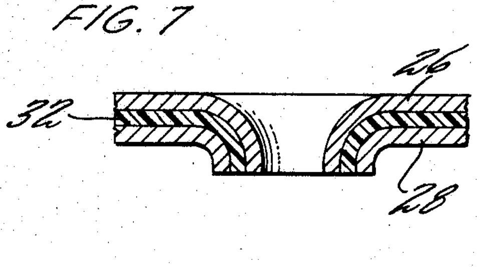
FIGURE 7 is a cross-sectional, partial side elevation view of another embodiment of the present invention as employed in multilayer circuitry.

Use of the present invention in association with multilayer circuitry is shown in FIGURES 6 and 7. FIGURE 6 depicts a multi-layer circuit having conductors 26 and 28 and insulating films 30, 32 and 34. In the formation of the drawn eyelet of FIGURE 6, the final punch configuration was such that conductor 28 extended beyond the plane defined by the bottom of insulating layer 34 while conductor 26 was drawn only slightly so as to extend through insulating layer 32 and into the through hole. The exposure of surfaces of conductors 26 and 28 within the punched hole permits layer-to-layer connection within the multilayer printed circuit by means of wave soldering.

In the assembly of FIGURE 7, the upper and lower insulating films, 30 and 34 respectively, were omitted and the drawing die configuration was such that both of conductors 26 and 28 were drawn into eyelets which extended beyond the plane initially defined by the lower surface of copper foil 28.

Tests have demonstrated that the embodiments of FIGURES 4 and 7 of the present invention may be fabricated employing "Duroid 8150" and "Kapton" as the substrate materials and 2 or 4-ounce copper as conductors. The 2-ounce copper is .0028 inch thick whereas the 4-ounce copper is .0056 inch thick. With both weights of conductive material, the completed eyelet or eyelets have been drawn, employing a tool similar to that shown in FIGURE 8, in a single-step operation.

What is claimed is:

1. A method of forming a through-hole connection in a multilayer printed circuit, said multilayer circuit being produced by forming conductive paths on a plurality of sheets of plastic film material and thereafter laminating said sheets of plastic film material to provide a multilayer structure having vertically displaced conductive portions separated by and supported on a single sheet of plastic film material, said method comprising:

punching a hole completely through the multilayer circircuit in a location where the hole will intercept conductive paths on a plurality of vertically displaced plastic films within the circuit;

simultaneously drawing the thus intercepted conductive material into eyelets which extend through the film of insulating material next adjacent each conductive portion in the direction of punch travel through the circuit; and interconnecting the exposed inner surfaces of the drawn eyelets to provide layer-to-layer electrical communication within the multilayer circuit.

References Cited

UNITED STATES PATENTS

| | | | |
|---|---|---|---|
| 1,794,831 | 3/1931 | Caruso | 29—625 |
| 2,433,384 | 12/1947 | McLarn. | |
| 3,072,734 | 1/1963 | Fox et al. | 174—68.5 |
| 3,345,741 | 10/1967 | Reimann | 174—68.5 XR |
| 2,302,332 | 11/1942 | Leekley. | |
| 2,550,682 | 5/1951 | Falkenberg et al. | |

OTHER REFERENCES

German printed application 1,246,840 (1967).

DARRELL L. CLAY, Primary Examiner

U.S. Cl. X.R.

174—68.5